United States Patent
Khalil et al.

(10) Patent No.: US 6,621,437 B2
(45) Date of Patent: Sep. 16, 2003

(54) MULTIPLEXED DIGITAL-TO-ANALOG CONVERTERS USED IN COMMUNICATION DEVICES

(75) Inventors: Waleed Khalil, Tempe, AZ (US); Chunlei Shi, San Diego, CA (US); James Wilson, Palm Harbor, FL (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/043,725

(22) Filed: Jan. 8, 2002

(65) Prior Publication Data

US 2003/0128142 A1 Jul. 10, 2003

(51) Int. Cl.[7] ................................................ H03M 1/66
(52) U.S. Cl. ........................................ 341/144; 341/141
(58) Field of Search ................................... 341/141, 144

(56) References Cited

U.S. PATENT DOCUMENTS

| | | | | |
|---|---|---|---|---|
| 3,588,880 A | * | 6/1971 | Gross et al. ................. 341/117 |
| 3,806,917 A | * | 4/1974 | Gronner et al. ............. 341/117 |
| 3,889,063 A | * | 6/1975 | Slavin .......................... 179/15 |
| 4,591,832 A | * | 5/1986 | Fling et al. .................. 340/347 |
| 4,677,422 A | * | 6/1987 | Naito .......................... 341/122 |
| 4,845,498 A | * | 7/1989 | Kubo et al. ................. 341/131 |
| 4,933,676 A | * | 6/1990 | Hauge et al. ............... 341/141 |
| 5,155,488 A | * | 10/1992 | Takahashi ................... 341/144 |
| 5,736,949 A | * | 4/1998 | Ong et al. ................... 341/141 |
| 6,191,720 B1 | * | 2/2001 | Zhang ......................... 341/144 |

* cited by examiner

Primary Examiner—Michael Tokar
Assistant Examiner—Khai Nguyen
(74) Attorney, Agent, or Firm—Blakely, Sokoloff, Taylor & Zafman LLP

(57) ABSTRACT

A system includes a transceiver having mixers, variable gain amplifiers, a modulator, a local oscillator and power amplifiers that may receive control signals generated by a Digital-to-Analog Converter (DAC). The DAC may include a multiplexer that receives digital values that are transferred to a DAC core, converted to analog values, and stored in sample-and-hold circuits. The one DAC may service multiple devices within the transceiver with control signals. A smart timer may generate select signals to the multiplexer and sample-and hold circuits to prioritize updating of the control signals.

11 Claims, 3 Drawing Sheets

MULTIPLEXED DIGITAL-TO-ANALOG CONVERTERS USED IN COMMUNICATION DEVICES

BACKGROUND

Transceivers in wireless communication devices may utilize Digital-to-Analog Converters (DACs) as building blocks in mixed mode chips. For instance, a signal received from the antenna may be demodulated in the receiver portion of the transceiver and a Programmable Gain Amplifier (PGA) may be used to adjust the amplitude of the demodulated baseband signal. In the transmitter portion, a Power Amplifier (PA) may set the strength of the signal transmitted from the antenna. DACs may be used in the transceiver to provide control signals to the PGAs and PAs to set and adjust the amplitudes of the RF signals used by the RF circuitry. Also, transceivers may use DACs to control the operating frequency of Voltage Controlled Oscillators (VCOs) that may be used in the modulation/demodulation process.

Transceivers designed for the Code Division Multiple Access (CDMA) standard typically incorporate about six to eight DACs while a transceiver designed to the Global System for Mobile Communications (GSM) standard may have four to six DACs. The low-speed, high-resolution DACs convert digital signals into analog signals that may control the PGAs or PAs. DACs are typically designed from transistors, capacitors and resistors. A DAC may incorporate relatively large capacitors that may be obtained from the gate capacitance of transistors or the capacitance between metal layers as fabricated in a Metal Oxide Semiconductor (MOS) process. The resistors in a DAC may be obtained using the resistivity of the polysilicon gate layer or the source/drain diffused regions. Hence, the large capacitors and resistors in DACs may take up silicon area and consume power in converting digital input signals to analog output signals. Thus, there is a need for a wireless communication device to provide an efficient way to implement DACs that may reduce the silicon area and consumed power.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements illustrated in the figures have not necessarily been drawn to scale. For example, the dimensions of some of the elements are exaggerated relative to other elements for clarity.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Figure 1:
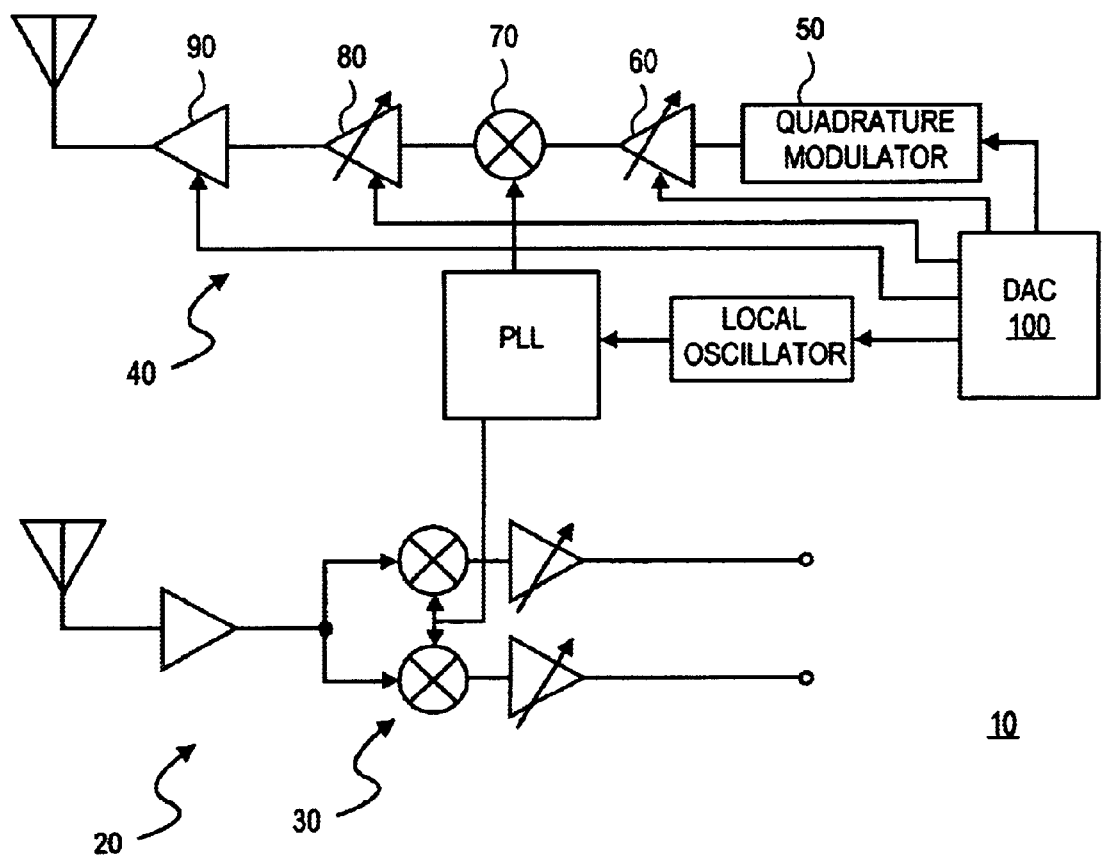
FIG. 1 is a block diagram that illustrates the use of DACs to control functions of a wireless communication device.

FIG. 1 is a block diagram that illustrates the use of DACs for controlling signal processing within a transceiver of a wireless communications device. Unless specifically stated otherwise, as apparent from the following discussions, it is appreciated that throughout the specification discussions utilizing terms such as "processing", "converting", "transferring", "multiplexing", or the like, refer to the action and/or processes of a transceiver that manipulates and/or modulates/demodulates data. Other functional blocks such as, for example, a microprocessor, a Digital Signal Processor (DSP), a microcontroller, a Reduced Instruction Set Computing (RISC) processor, an ARM™ core from ARM Holdings in Cambridge, England, a StrongARM™ core or an XScale™ core from Intel Corporation in Santa Clara, Calif., or an embedded core may be included with the transceiver. It should be understood that only the transceiver portion of the integrated circuit or processor is illustrated in FIG. 1 and that the scope of the present invention is not limited to these examples.

The architecture presented in the embodiments of the invention may have application to products in portable computing, networking, digital camera applications, wireless technology and a wide range of consumer products based on instrumentation and automotive applications. It should be further understood that the circuits disclosed herein may be used in many systems that include, by way of example only, cellular radiotelephone communication systems, Personal Communication Systems (PCS), modems, two-way radio communication systems, one-way and two-way pagers, Personal Digital Assistants (PDA's) and other hand held devices.

FIG. 1 is a block diagram for a transceiver 10 that illustrates the use of a DAC in accordance with an embodiment of the present invention. The modulated Radio Frequency (RF) signals received at the antenna may contain information that may be recovered in a receiver portion 20 of the electronic system. An RF mixer 30 may receive the incoming modulated RF signals and along with a generated Local Oscillator (LO) signal down convert the high frequency modulated signal to a lower Intermediate Frequency (IF) signal for demodulation. Thus, the modulated signal and the LO signal may be "mixed" to translate the carrier frequency of the modulated signal from the RF range to the Intermediate Frequency (IF) range. The down converted signals may then be processed.

A transmitter portion 40 of transceiver 10 may modulate an IF signal in a quadrature modulator 50. A variable gain amplifier 60 may receive the modulated IF signal and generate an amplified output signal that may then be unconverted by a mixer 70 to a modulated RF signal. A variable gain amplifier 80 may set the signal strength of the unconverted RF signal and a power amplifier 90 may control the output power of the signal transmitted from the antenna.

In accordance with an embodiment of the present invention, quadrature modulator 50, variable gain amplifier's 60 and 80, the local oscillator and power amplifier 90 may receive control signals generated by a DAC 100. It should be noted that DAC 100 may provide control signals for any number of devices and those shown in FIG. 1 are exemplary. For instance, power amplifier 90 may have multiple stages that require additional control signals that may be generated by DAC 100. It should be further understood that the circuits disclosed herein may use differential signals, quadrature signals or single-ended signals without limiting the scope of the invention.

Figure 2:
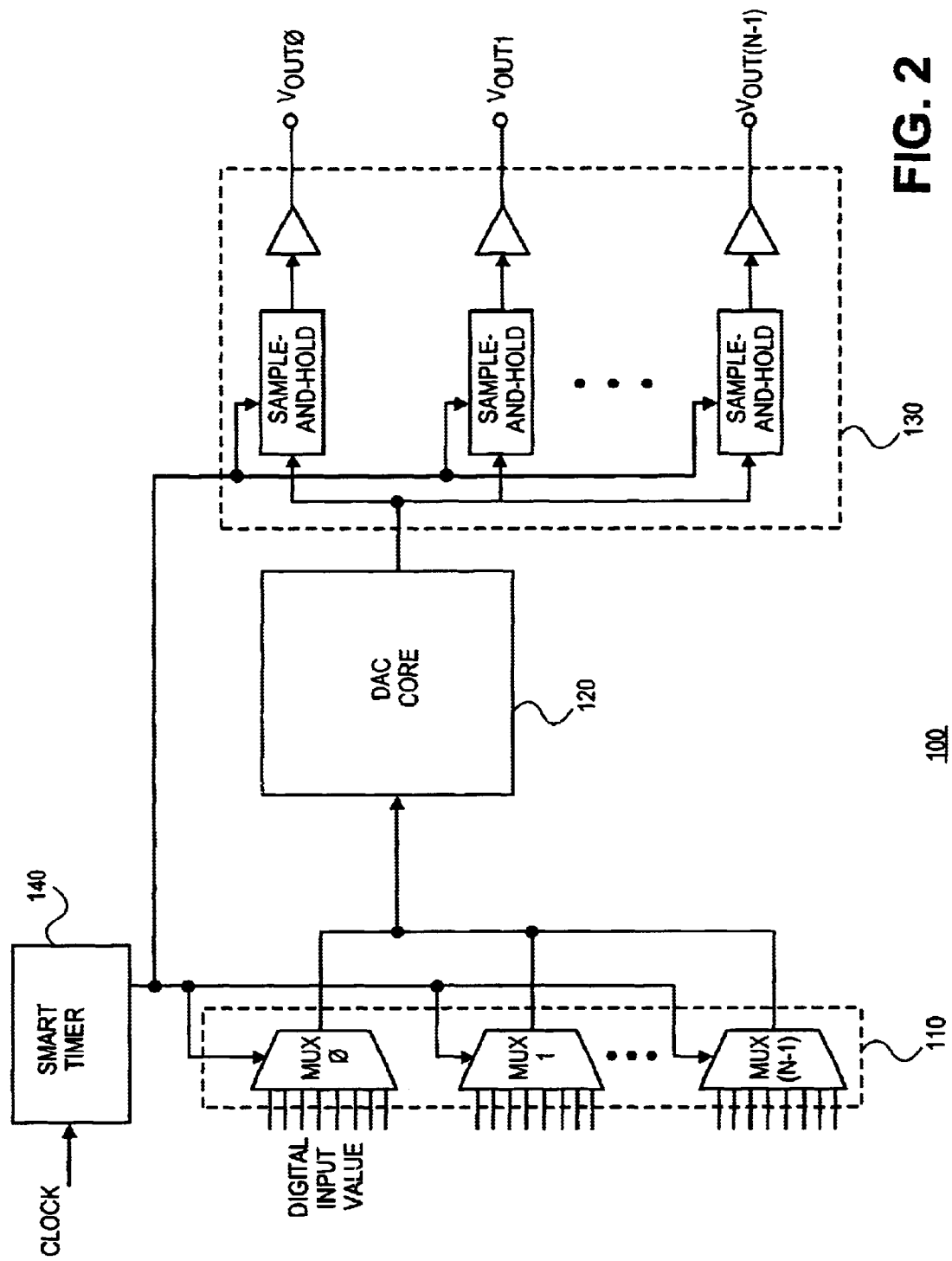
FIG. 2 is a block diagram that shows a DAC having multiplexed inputs in accordance with an embodiment of the present invention.

FIG. 2 is a block diagram that shows DAC 100 having multiplexed inputs and sample-and-hold circuits on the DAC outputs in accordance with an embodiment of the present invention. An input block 110 is shown having N multiplexers that may be selected by a signal provided from a smart timer block 140, where N is an inter number. When one of the multiplexers is selected, the digital signals received at the inputs of that multiplexer may be transferred by a bus to the inputs of a DAC core 120. DAC core 120 generates an analog output signal that is proportional to the input value of the digital signals. It is not intended that the choice of DAC core 120 limit the present invention. In other words, the embodiment of the present invention is not limited by the specific method of conversion employed (a folded DAC), the resolution of the DAC as related to the number of bits or the voltage range or linearity of the DAC. It is further assumed that the accuracy of matching components within DAC core 120, and hence the general accuracy of DAC 100, is adequate for use in transceiver 10.

The value of the analog signal generated by DAC core 120 in response to the input value of the digital signals may be captured in a sample-and-hold circuit and then buffered to provide an analog output signal. Output block 130 includes N sample-and-hold circuits and corresponding buffer combinations. It should be noted that multiplexers in input block 110 typically have a corresponding sample-and-hold/buffer combination that captures and holds the analog output signal generated by DAC core 120. Thus, a multiplexer in input block 110 may be selected to provide a digital value to DAC core 120 and a sample-and-hold circuit may be selected to receive and hold the generated analog output signal. It should be noted that the analog output signals $V_{OUT0}$, $V_{OUT1}$, . . . , and $V_{OUT(N-1)}$ may be a voltage potential, but alternatively may be a current flow. It should be further noted that the buffers may or may not provide continuous short circuit protection or over-voltage protection, and the inclusion or omission of protection is not intended as a limitation of any embodiment of the present invention.

The outputs of DAC 100 that provide the signals $V_{OUT0}$, $V_{OUT1}$, . . . , and $V_{OUT(N-1)}$ are shown in FIG. 1 and may be connected to quadrature modulator 50, variable gain amplifier's 60 and 80, the local oscillator and power amplifier 90. Thus, as shown, a single DAC may be used to generate analog control signals for multiple blocks in transceiver 10.

Figure 3:
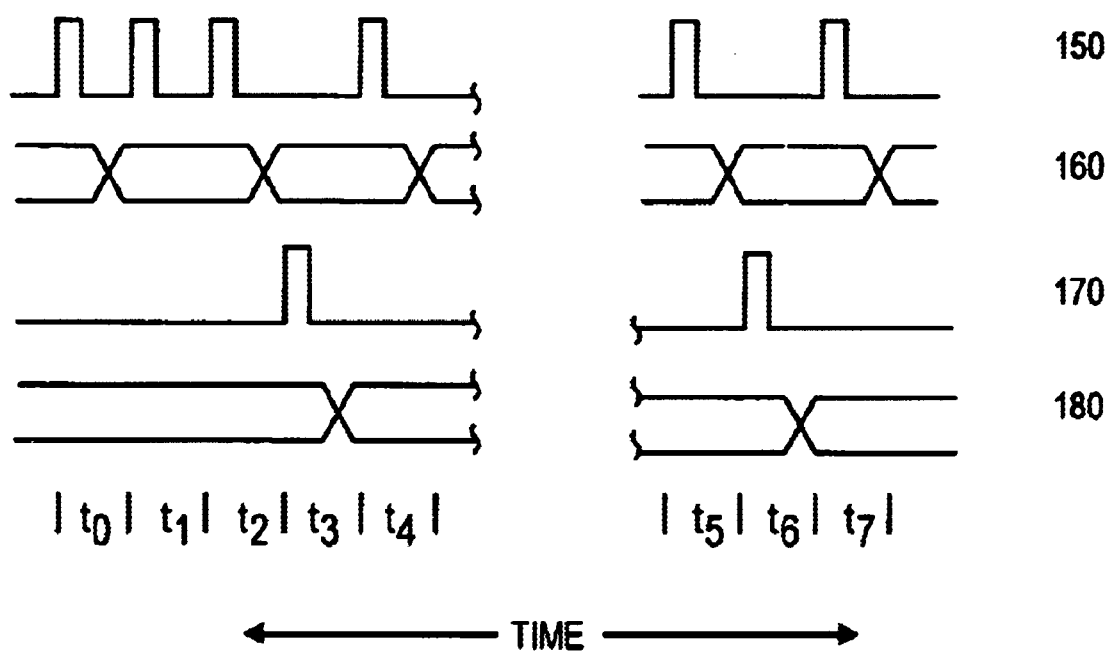
FIG. 3 is a timing diagram showing the time periods when inputs may be processed and the analog output generated by the DAC shown in FIG. 2.

FIG. 3 is a timing diagram showing the time periods when digital input values may be processed through DAC core 120 and analog output signals may be captured in output block 130. The horizontal axis represents time and the labels $t_0$, $t_1$, $t_2$, $t_3$, $t_4$, $t_5$, $t_6$ and $t_7$ illustrate time periods having a value, for example, of about 5 microseconds, although this is not a limitation of the present invention. Referring to FIGS. 2 and 3, waveform 150 illustrates the timing for a signal generated by smart timer 140 that may select MUX 0 and the corresponding sample-and-hold/buffer combination. In this example, DAC 100 illustrates two different output rate values, namely the voltage $V_{OUT0}$ being updated at 10 microsecond intervals and the signal $V_{OUT1}$ being updated at 100 microsecond intervals. Waveform 160 illustrates the time at which a new analog voltage value $V_{OUT0}$ may be generated by DAC 100 and provided to quadrature modulator 50. Even though waveform 150 shows an-updated signal at 5 microsecond intervals for selecting MUX 0 and the sample-and-hold/buffer combination, note that waveform 160 shows the analog control voltage $V_{OUT0}$ being updated at 10 microsecond intervals and not 5 microsecond intervals. This is based on DAC 100 receiving new digital input values at 10 microsecond intervals.

Waveform 170 illustrates a signal generated by smart timer 140 that may select MUX 1 and the corresponding sample-and-hold/buffer combination. Waveform 180 illustrates the time at which a new analog voltage $V_{OUT1}$ may be generated by DAC 100 and provided to power amplifier 90 (see FIG. 1). As pointed out in the example and illustrated in FIG. 3, DAC 100 may generate analog control signals that may be used by a variety of electronic devices. Note that a priority may be assigned, the priority providing that selected control signals are updated at a higher rate than other control signals. In this example, waveform 160 shows the analog voltage $V_{OUT1}$ being updated during $t_0$, $t_2$, $t_4$, $t_5$ and $t_7$, representing an update at 10 microsecond intervals. On the other hand, waveform 180 shows analog voltage $V_{OUT2}$ being updated during $t_3$ and $t_6$, representing an update at 100 microsecond intervals. Thus, quadrature modulator 50 may have a higher priority than power amplifier 90, and thus, receive a control signal more often. The higher priority may be characterized by DAC 100 updating the analog voltage $V_{OUT0}$ at a higher rate than the analog value $V_{OUT1}$.

As shown and described, one DAC may generate and supply multiple analog control signals that may be used by transceiver 10 or another system. The control signals may be updated or changed at selected time periods. By now it should be appreciated that a transceiver has been presented that may use one DAC having multiplexed inputs and sample-and-hold circuitry on the outputs to provide control signals for other circuitry in the transceiver. It has also been shown that in particular embodiments by using a smart timer, the single DAC may generate analog control signals that may have update rate requirements that are different from each other. A DAC in accordance with a particular embodiment of the present invention may reduce the silicon area and the consumed power in the transceiver.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A system comprising:
   first and second multiplexers having inputs to receive respective first and second digital values;
   a Digital-to-Analog Converter (DAC) having inputs coupled to outputs of the first and second multiplexers;
   first and second sample-and-hold circuits coupled to an output of the DAC; and
   a timer circuit to provide a first signal to the first sample-and-hold circuit and a second signal to the second sample-and-hold circuit, where the first and second signals have different frequencies.

2. The system of claim 1 wherein the second signal selects the second multiplexer to transfer the second digital value to the DAC and the second sample-and-hold circuit to receive a second analog signal from the DAC.

3. The system of claim 1 further including a first buffer coupled to an output of the first sample-and-hold circuit to supply a first analog signal to a power amplifier.

4. The system of claim 1, wherein the first signal to the first sample-and-hold circuit has a frequency that is an integer multiple of the frequency of the second signal to the second sample-and-hold circuit.

5. The system of claim 1, further comprising a second buffer coupled to an output of the second sample-and-hold circuit to supply a second analog signal to a variable gain stage of an RF transceiver.

6. A system comprising:

a Digital-to-Analog Converter (DAC) having inputs to receive first and second digital values that are converted to corresponding first and second analog values; and first and second sample-and-hold circuits to store the first and second analog values, wherein a first signal selects the first digital value for transfer to the DAC and the first sample-and-hold circuit to store the first analog value and a second signal selects the second digital value for transfer to the DAC and the second sample-and-hold circuit to store the second analog value, where the first and second signals have different frequencies.

7. The system of claim 6 wherein the first digital value is converted to the first analog value in a first time period that is substantially an integer multiple of a second time period used to convert the second digital value to the second analog value.

8. The system of claim 7, further comprising:

a smart timer to provide the first signal to the first sample-and-hold circuit and the second signal to the second sample-and-hold-circuit.

9. The system of claim 6 further including first and second buffers coupled to the first and second sample-and-hold circuits to control a power amplifier and a variable gain stage of an RF transceiver.

10. A method comprising:

generating a first analog signal from a first digital value received by a Digital-to-Analog Converter (DAC) in a first time period;

generating a second analog signal from a second digital value received by the DAC in a second time period;

generating a third analog signal from a third digital value received by the DAC in a third time period; and storing the first and second analog signals to control a power amplifier and a variable gain stage during the third time period.

11. The method of claim 10 further comprising multiplexing first, second and third digital values to inputs of the DAC.

* * * * *